US012686917B2

(12) United States Patent
Kim et al.

(10) Patent No.: US 12,686,917 B2
(45) Date of Patent: Jul. 21, 2026

(54) METHODS FOR DEPOSITING A FILM ON A SURFACE OF A SUBSTRATE BY CYCLICAL DEPOSITION METHODS INCLUDING PULSED PURGE PROCESSES

(71) Applicant: ASM IP Holding B.V., Almere (NL)

(72) Inventors: Do Han Kim, Phoenix, AZ (US); Jereld Lee Winkler, Gilbert, AZ (US); Amit Mishra, Tempe, AZ (US); Paul Ma, Scottsdale, AZ (US); Todd Robert Dunn, Cave Creek, AZ (US); Moataz Bellah Mousa, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 53 days.

(21) Appl. No.: 18/673,554

(22) Filed: May 24, 2024

(65) Prior Publication Data

US 2024/0401190 A1     Dec. 5, 2024

Related U.S. Application Data

(60) Provisional application No. 63/469,707, filed on May 30, 2023.

(51) Int. Cl.
| | |
|---|---|
| *C23C 16/40* | (2006.01) |
| *C23C 16/04* | (2006.01) |
| *C23C 16/44* | (2006.01) |
| *C23C 16/455* | (2006.01) |

(52) U.S. Cl.
CPC .......... *C23C 16/403* (2013.01); *C23C 16/045* (2013.01); *C23C 16/4408* (2013.01); *C23C 16/45525* (2013.01); *C23C 16/45527* (2013.01); *C23C 16/45557* (2013.01)

(58) Field of Classification Search
CPC ...................... C23C 16/4408; C23C 16/45527
See application file for complete search history.

(56) References Cited

U.S. PATENT DOCUMENTS

| | | |
|---|---|---|
| 6,673,701 B1 | 1/2004 | Marsh |
| 6,783,590 B2 | 8/2004 | Lindfors |
| 7,271,077 B2 | 9/2007 | Marsh |
| 7,404,984 B2 | 7/2008 | Suntola |
| 8,016,945 B2 | 9/2011 | Zilbauer |
| 8,017,182 B2 | 9/2011 | Hendriks |
| 8,025,932 B2 | 9/2011 | Wolden |
| 8,946,036 B2 | 2/2015 | Chi |
| 9,029,244 B2 | 5/2015 | Won |
| 9,238,865 B2 | 1/2016 | Pomarede |

(Continued)

FOREIGN PATENT DOCUMENTS

| KR | 20190075587 A | 7/2019 |
|---|---|---|
| WO | 2023109307 A1 | 6/2023 |

OTHER PUBLICATIONS

George, Steven M., "Atomic Layer Deposition: An Overview," Chem Rev. 2010. 110, 111-311.

*Primary Examiner* — Alex A Rolland
(74) *Attorney, Agent, or Firm* — Snell & Wilmer L.L.P.

(57) ABSTRACT

Methods for depositing a film on a surface of substrate by cyclical deposition methods including pulsed purge processed are disclosed. The pulsed purge processes include introducing a purge gas into a reaction chamber at a first flow rate, and introducing a purge gas into the reaction chamber at second flow rate, the first flow rate being different to the second flow rate.

24 Claims, 6 Drawing Sheets

610     620     630     640

(56)                References Cited

U.S. PATENT DOCUMENTS

| | | | |
|---|---|---|---|
| 9,631,276 B2 | 4/2017 | Chandrasekharan |
| 9,984,869 B1 | 5/2018 | Blanquart |
| 10,049,911 B2 | 8/2018 | Swaminathan |
| 10,204,788 B1 | 2/2019 | Ye |
| 10,428,419 B2 | 10/2019 | Huotari |
| 10,978,337 B2 | 4/2021 | Lin |
| 11,453,943 B2 | 9/2022 | Fukazawa |
| 11,479,856 B2 | 10/2022 | Kumar |
| 11,501,973 B2 | 11/2022 | Raisanen |
| 11,814,727 B2 | 11/2023 | Liu |
| 2001/0034123 A1 | 10/2001 | Jeon |
| 2002/0108570 A1 | 8/2002 | Lindfors |
| 2003/0134508 A1 | 7/2003 | Raaijmakers |
| 2003/0224107 A1 | 12/2003 | Lindfors |
| 2005/0008779 A1 | 1/2005 | Yang |
| 2005/0016956 A1 | 1/2005 | Liu |
| 2005/0037154 A1 | 2/2005 | Koh |
| 2005/0061243 A1 | 3/2005 | Sarigiannis |
| 2005/0221004 A1 | 10/2005 | Kilpela |
| 2006/0062916 A1 | 3/2006 | Won |
| 2006/0121689 A1 | 6/2006 | Basceri |
| 2006/0147626 A1 | 7/2006 | Blomberg |
| 2006/0210712 A1 | 9/2006 | Park |

| | | | |
|---|---|---|---|
| 2008/0305561 A1* | 12/2008 | Govindarajan ... | C23C 16/45529 |
| | | | 257/E21.651 |
| 2009/0041952 A1 | 2/2009 | Yoon | |
| 2010/0003404 A1 | 1/2010 | Sneh | |
| 2010/0266765 A1 | 10/2010 | White | |
| 2011/0212628 A1 | 9/2011 | Li | |
| 2011/0311726 A1 | 12/2011 | Liu | |
| 2014/0060430 A1 | 3/2014 | Oosterlaken | |
| 2014/0113457 A1 | 4/2014 | Sims | |
| 2015/0284848 A1 | 10/2015 | Nakano | |
| 2017/0009346 A1 | 1/2017 | Kumar | |
| 2017/0145564 A1 | 5/2017 | Bertuch | |
| 2018/0082886 A1 | 3/2018 | Swaminathan | |
| 2019/0066997 A1 | 2/2019 | Klaver | |
| 2019/0206677 A1 | 7/2019 | Abel | |
| 2020/0098603 A1* | 3/2020 | Kamakura ........ | H01L 21/67017 |
| 2020/0181774 A1 | 6/2020 | Pudas | |
| 2020/0266097 A1 | 8/2020 | Liu | |
| 2021/0123128 A1 | 4/2021 | Zhu | |
| 2021/0156026 A1 | 5/2021 | Liu | |
| 2021/0404059 A1 | 12/2021 | Rasheed | |
| 2022/0059340 A1 | 2/2022 | Susa | |
| 2023/0360905 A1 | 11/2023 | Werner | |
| 2024/0102160 A1 | 3/2024 | Ahn | |
| 2024/0110279 A1 | 4/2024 | Kadam | |

* cited by examiner

100

METHODS FOR DEPOSITING A FILM ON A SURFACE OF A SUBSTRATE BY CYCLICAL DEPOSITION METHODS INCLUDING PULSED PURGE PROCESSES

CROSS-REFERENCE TO RELATED APPLICATIONS

This application is a nonprovisional of, and claims priority to and the benefit of, U.S. Provisional Patent Application No. 63/469,707, filed May 30, 2023 and entitled "METHODS FOR DEPOSITING A FILM ON A SURFACE OF A SUBSTRATE BY CYCLICAL DEPOSITION METHODS INCLUDING PULSED PURGE PROCESSES," which is hereby incorporated by reference herein.

FIELD OF INVENTION

The present disclosure relates generally to the field of semiconductor processing methods and systems, and to the field of device and integrated circuit manufacture. In particular, the present disclosure generally relates to methods for depositing a film on a surface of a substrate by cyclical deposition methods including pulsed purge processes.

BACKGROUND OF THE DISCLOSURE

As semiconductor device structures decrease in size with each technology node, certain devices and circuits are employing structures with high aspect ratio (HAR) features to better utilized the available chip area. For example, certain dynamic random access memory (DRAM) capacitors employ deep trenches which can be very narrow and deep, having aspect ratios of 25:1 or greater. In addition, three-dimensional transistor structures, such as, gate-all-around device structures, can include both HAR vertical and horizontal features.

When depositing a film on a surface of a substrate including HAR features it is commonly desirable that the film is deposited conformally to the underlying topography of the features. However, it can be difficult to uniformly deposit films directly over such HAR features while still maintaining the desired film properties. In addition, the filling of HAR features with a deposited film, in a process commonly referred as "gap-fill", can be challenging as the deposited gap-filing film is often required to be free of undesirable voids and/or seams.

For example, when utilizing atomic layer deposition processes to deposit a conformal film and/or gap-filling film on a surface of a substrate including HAR features it can be challenging to purge excess reactants and reactant by-products from the HAR features, especially from the bottom of deep trench features and/or in deep horizontal features. Accordingly, methods are desirable for enabling conformal, uniform deposition on substrates including HAR features as well as methods that enable the filling of HAR features with a gap-filling film without the formation of undesirable voids and/or seams.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods for depositing a film on a surface of substrate by cyclical deposition methods, such as atomic layer deposition, for example. In particular, the embodiments of the present disclosure relate to cyclical deposition methods including pulsed purge processes. In addition, the embodiments of the present disclosure relate to apparatus for performing the cyclical deposition methods disclosed herein.

In accordance with exemplary embodiments of the current disclosure, methods for depositing a film on a surface of a substrate are disclosed. The methods of the current disclosure include, seating a substrate within a reaction chamber, sequentially and alternatingly contacting the substrate with a plurality of pulsed reactant flows of at least a first reactant and a second reactant, and performing one or more cycles of a pulsed purge process between selected pulsed reactant flows to introduce a purge gas into the reaction chamber. A unit cycle of the pulsed purge process comprises, introducing the purge gas into the reaction chamber at a first flow rate; and introducing the purge gas into the reaction chamber at a second flow rate, wherein the first flow rate is different to the second flow rate.

In some embodiments, the first flow rate is greater than the second flow rate.

In some embodiments, the second flow rate is zero.

In some embodiments, the pulsed purge process further comprises, sequentially and alternately increasing and decreasing the pressure within the reaction chamber.

In some embodiments, performing one or more cycles of the pulsed purge process further comprises, flowing the purge gas at the first purge flow rate into the reaction chamber through a first gas flow path, and flowing the purge gas at the second flow rate into the reaction chamber through a second gas flow path.

In some embodiments, the purge gas flow into the reaction chamber is sequentially and alternately switched between the first gas flow path and the second gas flow path.

In some embodiments, a fluidic circuit fluidically connecting a purge gas source to the reaction chamber comprises a low-flow channel and a high-flow channel.

In some embodiments, the first gas flow path comprises both the low-flow channel and the high-flow channel.

In some embodiments, the second gas flow path comprises the low-flow channel.

In some embodiments, flowing the purge gas at the first flow rate further comprises, flowing the purge gas through both the low-flow channel and the high-flow channel.

In some embodiments, flowing the purge gas at the second flow rate further comprises, flowing the purge gas through the low-flow channel.

In some embodiments, switching the purge gas flow between the first flow rate and the second flow rate comprises, closing a valve disposed along the high-flow channel.

In some embodiments, switching the purge gas flow between the second flow rate and first flow rate comprises, opening a valve disposed along the high-flow channel.

In some embodiments, switching between the first flow rate and the second flow rate is performed in less than 0.1 seconds.

In some embodiments, the pulse period for introducing the purge gas into the reaction chamber at the first flow rate is less than 30 second.

In some embodiments, the pulse period for introducing the purge gas into the reaction chamber at the second flow rate is less than 1 second.

In some embodiments, a duty cycle of the pulsed purge process is greater than 1 percent (%).

In some embodiments, the second reactant is selected from the group consisting of water vapor ($H_2O$), hydrogen peroxide vapor ($H_2O_2$), ammonia ($NH_3$), hydrogen ($H_2$), ozone ($O_3$), oxygen ($O_2$), and alcohol vapors.

In some embodiments, the first reactant has a sticking coefficient less than the second reactant.

In some embodiments, the deposited film comprises a conformal aluminum oxide film with a step coverage greater than 95 percent (%).

In some embodiments, the aluminum oxide film fills a plurality of non-planar features on the substrate without the formation of a seam within the non-planar features.

In some embodiments, the plurality of non-planar features comprise a plurality of three-dimensional partially fabricated device structures and the aluminum oxide film covers the plurality of three-dimensional partially fabricated device structures with a step coverage greater than 98 percent (%).

In accordance with further exemplary embodiments of the current disclosure, methods for depositing a film on a surface of a substrate can also include, seating a non-planar substrate within a reaction chamber, and depositing a conformal film on a surface of the non-planar substrate by performing one or more deposition cycles of a cyclical deposition process. In some embodiments, a unit deposition cycle of the cyclical deposition process includes, contacting the substrate with a first vapor phase reactant, contacting the substrate with a second vapor phase reactant, and between selected contacting steps, sequentially and alternately switching a flow path of a purge gas between a high-flow gas path and a low-flow gas path thereby cycling the flow rate of the purge gas into the reaction between a first flow rate and second flow rate, wherein the first flow rate is greater than the second flow rate.

In accordance with additional exemplary embodiments of the current disclosure, methods for depositing a film on a surface of a substrate can also include, seating a non-planar substrate within a reaction chamber, contacting the substrate with a plurality of pulsed flows of a reactant at spaced apart time intervals into the reaction chamber to depositing a film on the substrate, and performing a cyclical purge process to remove excess reactant from the reaction chamber between selected pulsed flows of the plurality of pulsed flows. In some embodiments, the cyclical purge process includes, increasing the pressure within the reaction chamber by introducing a purge gas into the reaction chamber at a first flow rate through a high-flow gas path, and decreasing the pressure within the reaction chamber by introducing the purge gas into the reaction chamber at a second flow rate though a low-flow gas path, wherein the first flow rate is greater than the second flow rate.

Apparatus constructed and arranged to perform any and all of the methods of present disclosure are also introduced and described.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
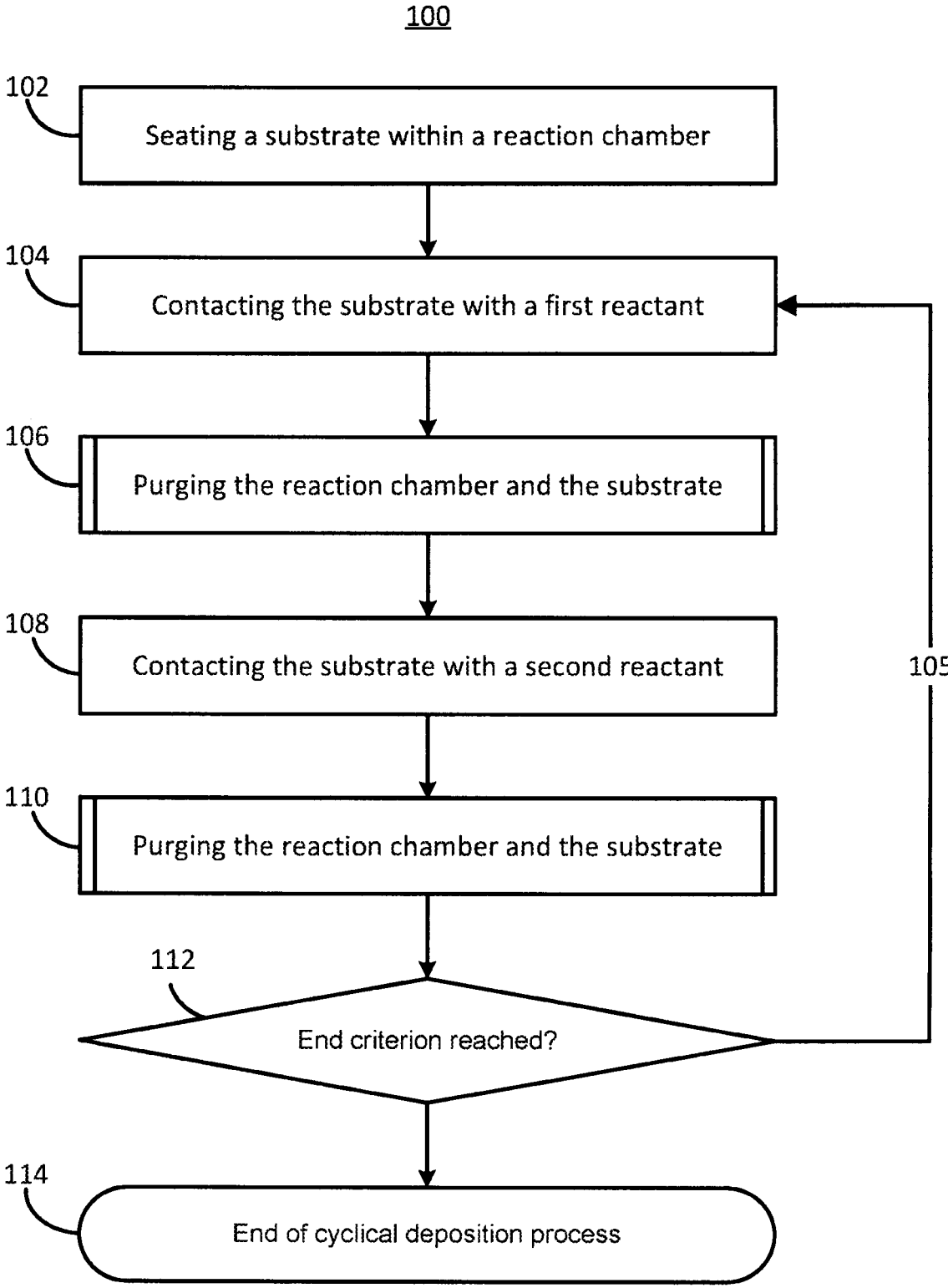
FIG. 1 illustrates an exemplary cyclical deposition method in accordance with the embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices, and apparatus provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

As used herein, the term "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a rare gas. The terms "rare gas" and "noble gas" as used herein may be used interchangeably. In some cases, the term "precursor" can refer to a compound that participates in the chemical reaction that produces another compound, and particularly to a compound that constitutes a film matrix or a main skeleton of a film; the term "reactant" may be used interchangeably with the term precursor.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material. Further, the term "substrate" may refer to any underlying material or materials that may be used, or upon which, a device, a circuit, or a film may be formed. The "substrate" may be continuous or non-continuous; rigid or flexible; solid or porous. The "substrate" may be in any form such as a powder, a plate, or a workpiece. Substrates in the form of a plate may include wafers in various shapes and sizes. Substrates may be made from materials, such as silicon, silicon germanium, silicon oxide, gallium arsenide, gallium nitride and silicon carbide for example. A continuous substrate may extend beyond the bounds of a process chamber where a deposition process occurs and may move through the process chamber such that the process continues until the end of the substrate is reached. A continuous substrate may be supplied from a continuous substrate feeding system allowing for manufacture and output of the continuous substrate in any appropriate form. Non-limiting examples of a continuous substrate may include a sheet, a non-woven film, a roll, a foil, a web, a flexible material, a bundle of continuous filaments or fibers (i.e., ceramic fibers or polymer fibers). Continuous substrates may also comprise carriers or sheets upon which non-continuous substrates are mounted.

As used herein, the term "film" and/or "layer" can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

In some embodiments of the disclosure, the substrate may comprise a non-planar substrate including a plurality of high aspect ratio (HAR) features, such as, for example, HAR vertical features (e.g., trench structures, vertical gap features, and/or fin structures) and/or HAR horizontal features (e.g., horizontal channels, and horizontal gap features).

In some embodiments, HAR vertical features may have an aspect ratio (height:width) which may be greater than 2:1, or greater than 5:1, or greater than 10:1, or greater than 25:1, or greater than 50:1, or greater than 100:1, wherein "greater than" as used in this example refers to a greater distance in the height (or depth) of the HAR feature. In some embodiments, HAR horizontal features may have an aspect ratio (height:width) which may be greater than 1:2, or greater than 1:5, or greater than 1:10, or greater than 1:25, or greater than 1:50, or even greater than 1:100, wherein "greater than" as used in this example refers to a greater distance in the width of the HAR feature.

In some embodiments, the methods of the present disclosure include, entirely filling a plurality of HAR features with a deposited film. In some embodiments, the methods of the present disclosure include, filling a plurality of non-planar HAR feature with a deposited film without the formation of voids or seams. In other words, in some embodiments, the exemplary deposition methods according to the present disclosure are continued until the HAR features are fully filled with a film, and substantially no voids or seams are formed in the filled HAR feature. The presence of voids or seams can be observed by studying the formed gap-filling film by high magnification microscopy methods, such as, for example, scanning tunneling electron microscope (STEM).

As used therein, the term "cyclic deposition process" or "cyclical deposition process" can refer to the sequential introduction of reactants into a reaction chamber to deposit a layer over a substrate and includes processing techniques such as atomic layer deposition (ALD), cyclical chemical vapor deposition (cyclical CVD), and hybrid cyclical deposition processes that include both an ALD component and a CVD component. In addition, the term "cyclic deposition process" can refer to plasma-enhanced cyclical deposition processes, such as, plasma-enhanced atomic layer deposition (PEALD) processes, for example. "Cyclical deposition processes" can also include spatial cyclical processes, such as, for example, spatial atomic layer deposition.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each deposition cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more deposition cycles, e.g., during each step of each cycle, to remove any excess precursor from the process chamber and/or remove any excess reactant and/or reaction byproducts from the reaction chamber.

As used herein, the term "comprising" indicates that certain features are included, but that it does not exclude the presence of other features, as long as they do not render the claim unworkable. In some embodiments, the term "comprising" includes "consisting."

As used herein, the term "consisting" indicates that no further features are present in the apparatus/method/product apart from the ones following said wording. When the term "consisting" is used referring to a chemical compound, substance, or composition of matter, it indicates that the chemical compound, substance, or composition of matter only contains the components which are listed. Likewise, when the term "consisting essentially" is used referring to a chemical compound, substance, or composition of matter, it indicates that the chemical compound, substance, or composition of matter contains the components which are listed but can also containing trace elements and/or impurities that do not materially affect the characteristics of said chemical compound, substrate, or composition of matter. This notwithstanding, the chemical compound, substance, or composition of matter may, in some embodiments, comprise other components as trace elements or impurities, apart from the components that are listed.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

In the specification, it will be understood that the term "on" or "over" may be used to describe a relative location relationship. Another element, film or layer may be directly on the mentioned layer, or another layer (an intermediate layer) or element may be intervened therebetween, or a layer may be disposed on a mentioned layer but not completely cover a surface of the mentioned layer. Therefore, unless the term "directly" is separately used, the term "on" or "over" will be construed to be a relative concept. Similarly to this, it will be understood the term "under", "underlying", or "below" will be construed to be relative concepts.

The embodiments of the present disclosure include methods for depositing a film on a surface of a substrate and particularly methods for depositing a film on non-planar substrates including high aspect ratio (HAR) features by cyclical deposition methods including pulsed purge processes. Such pulsed purge processes are utilized for enhancing the removal of excess reactants and any reactant by-products from the reaction chamber, and particular for removing excess reactants and any reactant by-products from HAR features on a substrate. The enhancement of the purging process can improve conformality of the deposited film, as well as improving the filling of the HAR features with a gap-filling film, i.e., by filling the HAR features without the formation of undesirable voids and/or seams.

In more detail, advanced technology node semiconductor structures can require strict deposition performance specifications in order to obtain deposited films with the desired characteristics. For example, deposition specifications for a deposited film can include, but are not limited to, near 100% step-coverage, seamless/voidless gap-fill, and a very low percentage non-uniformity in the thickness of the deposited film. To achieve such rigorous deposition requirements cyclical deposition processes, such as, atomic layer deposition (ALD) processes, for example, can require exceedingly tight process controls.

As a non-limiting example, the filling of HAR features on a substrate with a gap-filling film can be exceedingly challenging since the deposition processes require control over both the diffusion of the reactants into the HAR features as well as the efficient purging and removal of the excess reactant (and any by-products) from out of the HAR features. In addition, the edge thickness uniformity on a substrate can determine the overall non-uniformity of the deposition process and the purging efficiency of reactants from the edge of the substrate can be a major factor in achieving the desired deposition uniformity.

Commonly, cyclical deposition processes, such as atomic layer deposition (ALD), for example, employ a static, continuous purge gas flow for purging excess reactants and any reaction by-products from the reaction chamber and particular for removing such unwanted species from substrates including HAR features. Frequently, the efficiency of the purge process is controlled by the optimization of purging parameters, such as, for example, purge time, reaction chamber pressure, substrate temperature, and gas flow rate of the purge gas into the reaction chamber. However, the full optimization of such purging parameters may still be insufficient in obtaining films suitable for next generational technology nodes and even when purge optimization is possible, such optimized processes may have negative consequences on other aspects of the deposition process.

Therefore, the embodiments of the present disclosure relate to cyclical deposition methods including pulsed purge processes. In such embodiments, the conventional static, continuous purge gas flow can be replaced with pulsed purge processes which include the cycling of the purge gas flow rate into the reaction chamber from a high-flow rate regime to a low-flow rate regime (or vice versa). Pulsed purge processes can achieve a more efficient purging of HAR features on a substrate and can therefore enable conformal deposition and/or gap-filling of complex three-dimensional device structures, as well as improving the percentage non-uniformity of the deposited films. In addition, such pulsed purge processes can extend the lifetime of the deposition apparatus by improving the elimination of reactants and by-products from dead volumes within the reaction chamber.

The present disclosure therefore includes methods for depositing a film on a surface of a substrate, and such methods can include, seating a substrate within a reaction chamber and sequentially and alternatingly contacting the substrate with a plurality of pulsed reactant flows of at least a first reactant and a second reactant. To enhance conformality and/or gap-filling of high aspect ratio features, the cyclical deposition methods of the present disclosure can also include, performing one or more cycles of a pulsed purge process between selected pulsed reactant flows to introduce a purge gas into the reaction chamber. For example, a unit cycle of the pulsed purge process can include, introducing the purge gas into the reaction chamber at a first flow rate, and introducing the purge gas into the reaction chamber at a second flow rate, wherein the first flow rate is different from the second flow rate.

FIG. 1 illustrates an exemplary method 100 in accordance with the embodiments of the present disclosure. In brief, exemplary method 100 can include the process steps of, seating a substrate within a reaction chamber (process step 102) and employing a cyclical deposition process (cyclical process 105) for the deposition of a film on a surface of a substrate, the cyclical deposition process 105 being repeated a number of times until a desired film is deposited on the substrate. The cyclical process 105 includes purging processes (e.g., process steps 106 and 110) and one or more of these purging processes can comprise a pulsed purge process.

In more detail, exemplary method 100 may include the process step of seating a substrate within a reaction chamber (process step 102). The reaction chamber employed for the deposition processes of the present disclosure can include those configured for cyclical deposition processes, such as, atomic layer deposition, for example. The reaction chamber can be a standalone reaction chamber or part of a cluster tool. The reaction chamber may be a batch processing tool. In some embodiments, a flow-type reaction chamber can be utilized. In some embodiments, a showerhead-type reaction chamber may be utilized. In some embodiments, a space divided and reaction chamber may be utilized. In some embodiments, a high-volume manufacturing-capable single wafer reaction chamber may be utilized. In other embodiments, a batch reaction chamber comprising multiple substrates may be utilized. For embodiments in which a batch reaction chamber is used, the number of substrates may be in the range of 10 to 200, or 50 to 150, or even 100 to 130. The reaction chamber can be configured as a thermal reactor—with no plasma excitation apparatus. Alternatively, the reaction chamber can include direct and/or remote plasma apparatus, such as those utilized in plasma-enhanced atomic layer deposition (PEALD). The reaction chamber can also be configured for spatial cyclical deposition processes, such as, spatial atomic layer deposition, for example.

The above examples of suitable reaction chambers should not be construed as limiting the deposition methods, and particularly the pulsed purge processes, of the present disclosure to those of ALD and/or PEALD processes. For example, alternative deposition processes that include repeated cycles of reactant introduction and purging may utilize the cyclical deposition methods of the present disclosure.

The substrate disposed within the reaction chamber may be heated to a desired substrate temperature for the subsequent film deposition. For example, the substrate may be heated to a substrate temperature of less than 1000° C., or less than 800° C., or less than 600° C., or less than 400° C., or even less than 200° C. In some embodiments of the disclosure, the substrate temperature may be greater than room temperature, between 200° C. and 1000° C., or between 200° C. and 600° C., or between 200° C. and 400° C.

In addition to controlling the temperature of the substrate, the pressure in the reaction chamber may also be regulated to enable deposition of the desired film.

Once the desired substrate temperature and reaction chamber pressure have been achieved the exemplary method 100 may continue with the cyclical process 105 (FIG. 1) which can include the process steps of, contacting the substrate with a first reactant (process step 104), purging the reaction chamber and the substrate of excess first reactant and any reaction by-products (process step 106), contacting the substrate with a second reactant (process step 108), and purging the reaction chamber and the substrate of excess second reactant and any reaction by-products (110). The exemplary method 100 then continues with a decision gate 112 based on a selected end criterion, which can include film thickness and/or the completion of a predetermined number of repeated deposition cycles, for example. Upon successfully reaching the end criterion of the decision gate 112, the exemplary method 100 can terminate via the process step 114.

In some embodiments, one or both of the process steps for purging the reaction chamber and the substrate disposed therein (i.e., process steps 106 and 110) can employ pulsed purge processes, as described in more detail below with reference to FIGS. 2-6.

Figure 2:
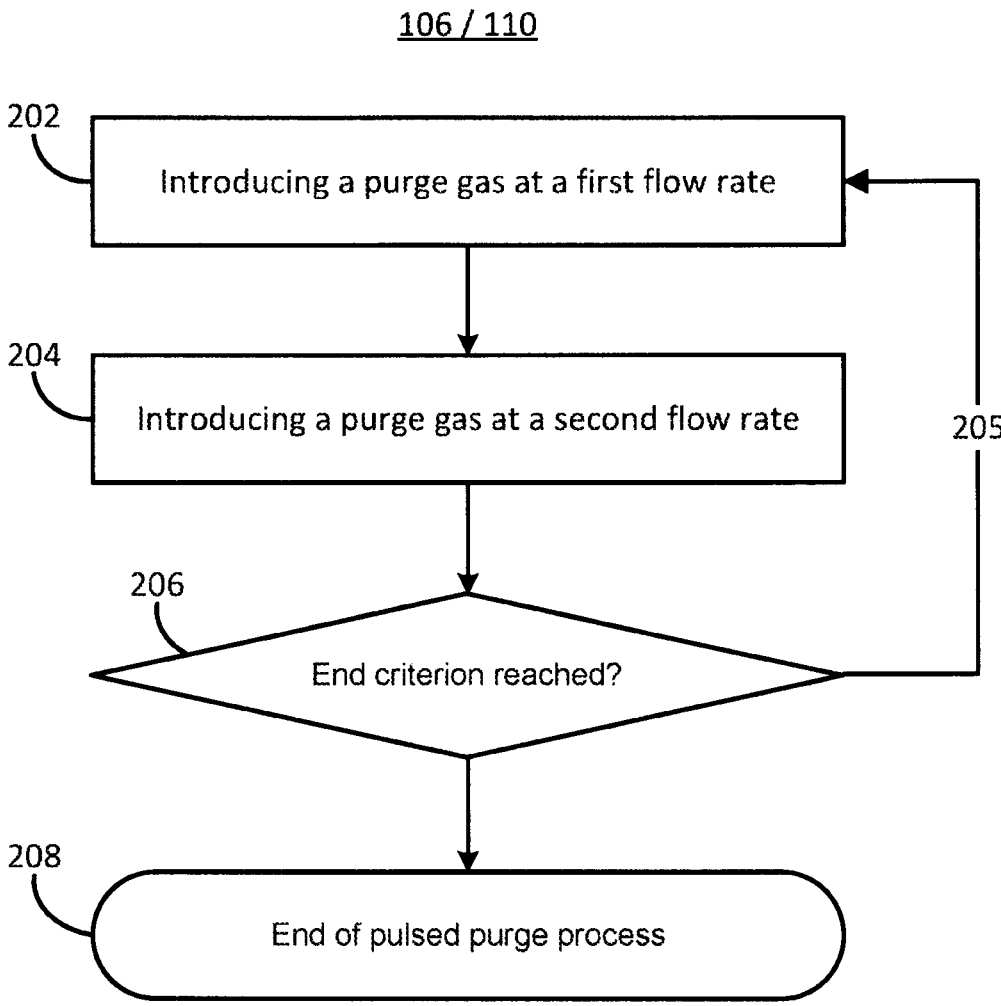
FIG. 2 illustrates an exemplary pulsed purge process in accordance with the embodiments of the disclosure.

In more detail, FIG. 2 illustrates the constituent sub-processes making up an exemplary pulsed purge processes that can be employed to purge the reaction chamber and the substrate therein during the cyclical deposition methods of the present disclosure. Therefore, in some embodiments, the cyclical deposition methods of the present disclosure include, performing one or more cycles of a pulsed purge process (cyclical process 205 of FIG. 2) between selected pulse reactant flows, wherein a unit cycle of the pulsed purge process (cyclical process 205) comprises, introducing the purge gas into the reaction at a first flow rate (sub-process step 202), and introducing the purge gas into the reaction at a second flow rate (sub-process step 204), wherein the first flow rate is different to the second flow rate. For example, in some embodiments, the first flow rate is greater than the second flow rate. In alternative embodiments, the second flow rate is greater than the first flow rate. In some embodiments, the first flow rate or the second flow rate may be zero, i.e., no flow of purge gas.

In some embodiments, the pulsed purge process may be performed in the reverse order to that illustrated in FIG. 2. For example, in some embodiments, a unit cycle of the pulsed purge process (cyclical process 205) comprises, introducing the purge gas into the reaction at a second flow rate, and introducing the purge gas into the reaction at a first flow rate, wherein the second flow rate is different to the first flow rate. For example, in some embodiments, the second flow rate is less than the first flow rate. In alternative embodiments, the second flow rate is greater than the first purge gas flow In some embodiments, the first flow rate can be greater than 0 SLM, or greater than 0.1 SLM, or greater than 1.0 SLM. In some embodiments, the first flow rate can be between 0 SLM and 0.1 SLM, or between 0.1 SLM and 1.0 SLM, or between 1.0 SLM and 2.0 SLM. Likewise, in some embodiments, the second flow rate can be greater than 0 SLM, or greater than 1.0 SLM, or greater than 10 SLM. In some embodiments, the second flow rate can be between than 0 SLM and 1 SLM, or between 1 SLM and 5 SLM, or between 5 SLM and 10 SLM.

The pulsed purge process (cyclical process 205 of FIG. 2) can be repeated a number of times. For example, the pulse purge process can include a decision gate (sub-process step 206) which determines if an additional cycle of the pulsed purge is performed. When the decision is made to repeat a further pulsed purge cycle, the exemplary pulsed purge process (FIG. 2) returns to the sub-process step 202, and a further pulse of purge is gas is introduced into the reaction chamber at the first flow rate (sub-process step 202), followed by the introduction of a further pulse of the purge gas into the reaction at the second flow rate (sub-process step 204) (or vice versa). The cycling of the flow rate of purge gas into the reaction chamber in order to purge the reaction chamber, and particular to purge the substrate disposed within the reaction chamber, can be repeated as many times as desired to achieve the desirable film deposition specifications. For example, in some embodiments, the pulsed purge process (cyclical process 205) can be performed 1, or 2, or 3, or 4, or 5, or 10, or 20, or 30, or 50 times, or even a greater number of times. Once the desired number of cycles of the pulsed purge process have been performed, the pulsed purge process may end as denoted by the sub-process step 208 which brings about the termination of the pulsed purge process.

The exemplary pulsed purge process of FIG. 2 is illustrated as having a repeating purge cycle (cyclical process 205) that commences by introducing the purge gas at a first flow rate, (sub-process step 202) (e.g. a high flow rate) followed by subsequently introducing the purge at a second flow rate 204 (e.g., a low flow rate), however it should be understood that the order of the sub-process steps can be reversed with the purge cycle (cyclical process 205) commencing by the introducing the purge gas at a second flow rate (e.g., a low flow rate) followed by subsequently introducing the purge gas a first flow rate (e.g., a high flow rate). In addition, the pulsed purge cycles of the present disclosure are not limited to cycles including a first flow rate and a second flow rate (as illustrated in FIG. 2) but can include two or more sub-processes with differing purge gas flow rates. Further, the pulsed purge cycles of the present disclosure may ramp the flow rate of the purge gas between the two or more sub-processes having differing flow rates (e.g., in a linear, or in a non-linear manner).

The pulsed purge process (FIG. 2) can be performed after the introduction of one or more reactants into the reaction chamber. For example, the pulsed purge process can be performed after the introduction of a first reactant and/or a second reactant into the reaction (i.e., after the process steps of 104 and/or 108 of the exemplary method 100 of FIG. 1). The number of cycles of the pulsed purge process can be determined, for example, by examination of the deposited film post deposition to determine if sufficient purging has been performed to achieved the specific film specifications, such as, for example, conformality of the film, and/or seamless/void free gap-filling of a plurality of high aspect features.

In some embodiments, performing the pulsed purge process can further comprises, sequentially and alternately increasing and decreasing the pressure within the reaction chamber. Alternatively, in some embodiments, performing the pulsed purge process can further comprise, sequentially and alternatively decreasing and increasing the pressure within the reaction chamber.

In some embodiments, the pulsed purge processes of the present disclosure (as illustrated in FIG. 2) can comprise, introducing the purge gas into the reaction chamber at a first flow rate (sub-process step 202) thereby resulting in an increase in the pressure in the reaction chamber, and subsequently, introducing the purge gas into the reaction at a second flow rate (sub-process step 204) thereby resulting in a decrease in the pressure in the reaction chamber. In such embodiments, the sequential and alternating cycling between a higher reaction chamber pressure and a lower reaction chamber pressure can be achieved by introducing the purge gas at a first flow rate (sub-process 202) which is greater than the second flow rate (sub-process 204). In addition, in such embodiments, as the pulsed purge process is repeated and the flow rate of purge gas is increased (sub-process step 202) and decreased (sub-process step 204) the resulting pressure in the reaction chamber sequentially and alternately cycles between a high pressure regime and a low pressure regime. As a non-limiting example, the sequential and alternating cycling between a higher reaction chamber pressure and a lower reaction chamber pressure can comprise, repeatedly switching between a reaction chamber greater than 2 Torr and a reaction chamber of less than 0.5 Torr.

In alternative embodiments, the pulsed purge process may performed in the reverse order to that described above, i.e., by sequential and alternating cycling between a lower reaction chamber pressure and a higher reaction chamber pressure by initial introducing the purge at a second flow rate which is less than a subsequent first flow rate. In such embodiments, as the cyclical pulsed purge process is repeated and the flow rate of purge gas is decreased and increased the resulting pressure in the reaction chamber sequentially and alternately cycles between a low pressure regime and a high pressure regime. As a non-limiting example, the sequential and alternating cycling between a lower reaction chamber pressure and a higher reaction chamber pressure can comprise, repeatedly switching between a reaction chamber less than 0.5 Torr and a reaction chamber of greater than 2 Torr.

Not to be bound by any particular theory or process, it is believed the sequential cycling of the purge gas flow rate (and/or the pressure within the reaction chamber) by the pulsed purge processes described herein can increase the efficiency of the purge process and thereby more effective remove excess reactants and any reaction by-products from the reaction chamber, and particular from a substrate including a plurality of HAR feature disposed within the reaction chamber. Such an increase in purging efficiency can consequently result in improved conformality of the deposited film, as well as the allowing for the deposition of a gap-filling film within a plurality of HAR features without the formation of unwanted seams/voids. In addition, the improved efficiency of the pulsed purge process of the present disclosure (when compared with the common static, continuous purge process) may result in purge cycles with shorter time periods, which can improve the overall cycle time of the cyclical deposition process and consequently increase the throughput of substrates through the deposition process and the deposition apparatus.

The sequential and alternating pulsed purge processes of the present disclosure may be achieved by various means. As a non-limiting example and with reference to FIG. 2, the repeating cycles of introducing the purge gas at a first flow rate (sub-process 202) and introducing the purge gas at a second flow rate (sub-process 204), wherein the first flow rate is different from the second flow rate, can be achieved by throttling the flow of the purge gas into the reaction chamber between the first flow rate and second flow rate. For example, the throttling of the flow rate of the purge gas may be achieved by means of a variable flow control device disposed along the flow path between a source of the purge gas and the reaction chamber. As a non-limiting example, a mass flow controller (MFC) can be employed along the flow path between the purge gas source and the reaction chamber and the MFC can be employed to repeatably increase and decrease (or vice versa) the flow rate of the purge gas into the reaction chamber. Alternatively, a variable pressure control device may be utilized to cycle the pressure (and the resulting flow of the purge gas) within the reaction chamber between a high pressure regime and a low pressure regime (or vice versa).

In some embodiments, the pulsed purge process of the present disclosure can be achieved by sequentially and alternately switching the flow of the purge gas between a first gas flow path and a second gas flow path. Therefore, in some embodiments of the disclosure, performing the pulsed purge process further comprises, flowing the purge gas at a first flow rate into the reaction through a first gas flow path, and flowing the purge gas at the second flow rate into the reaction chamber through a second gas flow path. In such embodiments, the purge gas flow into the reaction chamber is sequentially and alternatively switched between the first gas flow path and the second gas flow path.

Figure 3:
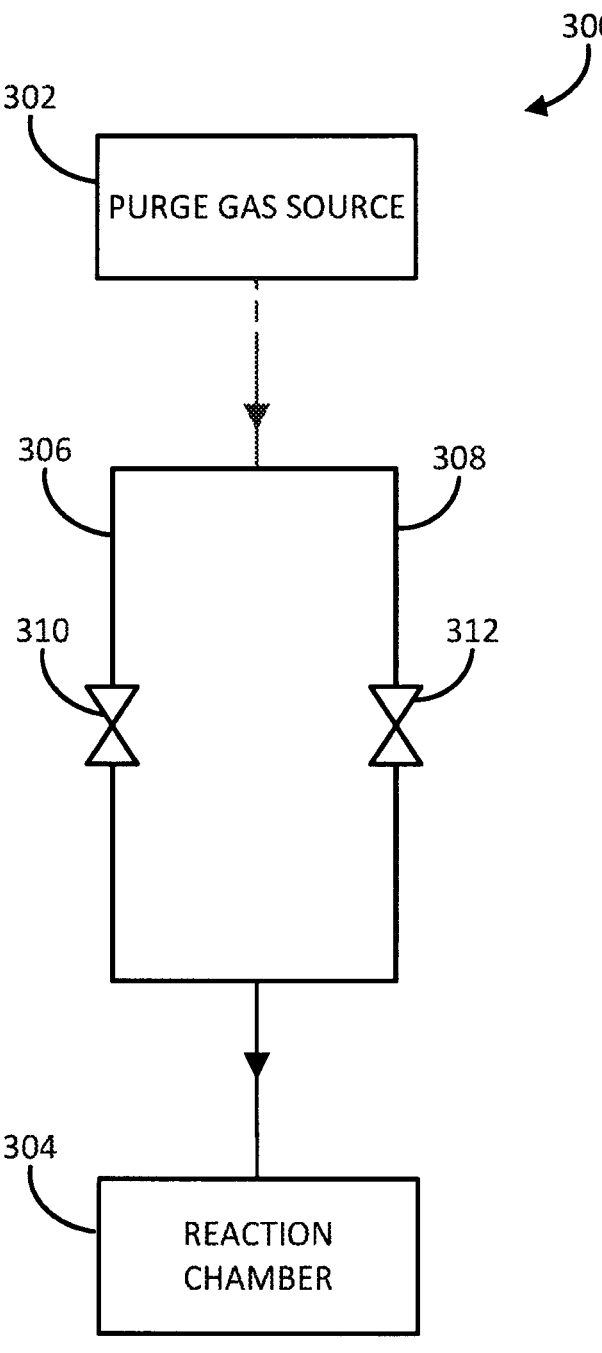
FIG. 3 illustrates an exemplary fluidic circuit for introducing a purge gas into a reaction chamber in accordance with the embodiments of the disclosure.

As a non-limiting example of the embodiments of the present disclosure, FIG. 3 illustrates an exemplary fluidic circuit which fluidically connects a source of purge gas to the reaction chamber.

In more detail, the exemplary fluidic circuit 300 of FIG. 3 comprises, a purge gas source 302, such as a vessel configured for the storage and delivery of a purge gas to the remaining portions of the fluidic circuit 300. In some embodiments, the purge gas source 302 can comprises a source of nitrogen ($N_2$), argon (Ar), or helium (He), for example. The purge gas source 302 is fluidically connected to a reaction chamber 304 via a low-flow channel 306 and a high-flow channel 308. A first valve 310 can be optionally be disposed along the low-flow channel 306 and a second valve 312 is disposed along the high-flow channel 308.

It should be noted that the exemplary fluidic circuit 300 as illustrated in FIG. 3 is in a simplified form to demonstrate the embodiments of the present disclosure and therefore the fluidic circuits employed to achieve the methods of the present disclosure may include additional components and apparatus. In particular, portions of the flow path between the purge gas source 302 and the reaction chamber 304 that are illustrated by a dashed line can indicate that additional flow paths, control devices, and apparatus, etc., can be included which are not illustrated herein in the interest of brevity.

The low-flow channel 306 can include the first valve 310 disposed along its path, and the high-flow channel 308 includes the second valve 312 disposed along it path. Therefore, in some embodiments, the flow of the purge gas from the purge gas source 302, to the reaction chamber 304, can be controlled by the opening and closing of one or both of the first valve 310 and second valve 312 to thereby switch the flow of the purge gas between a first flow path and a second flow path. For example, the low-flow channel 306 can comprises a conduit with a low gas conductance and/or high flow resistance, and the high-flow channel 308 can comprise a conduit with a high gas conductance and/or a low flow resistance.

Figures 4, 5:
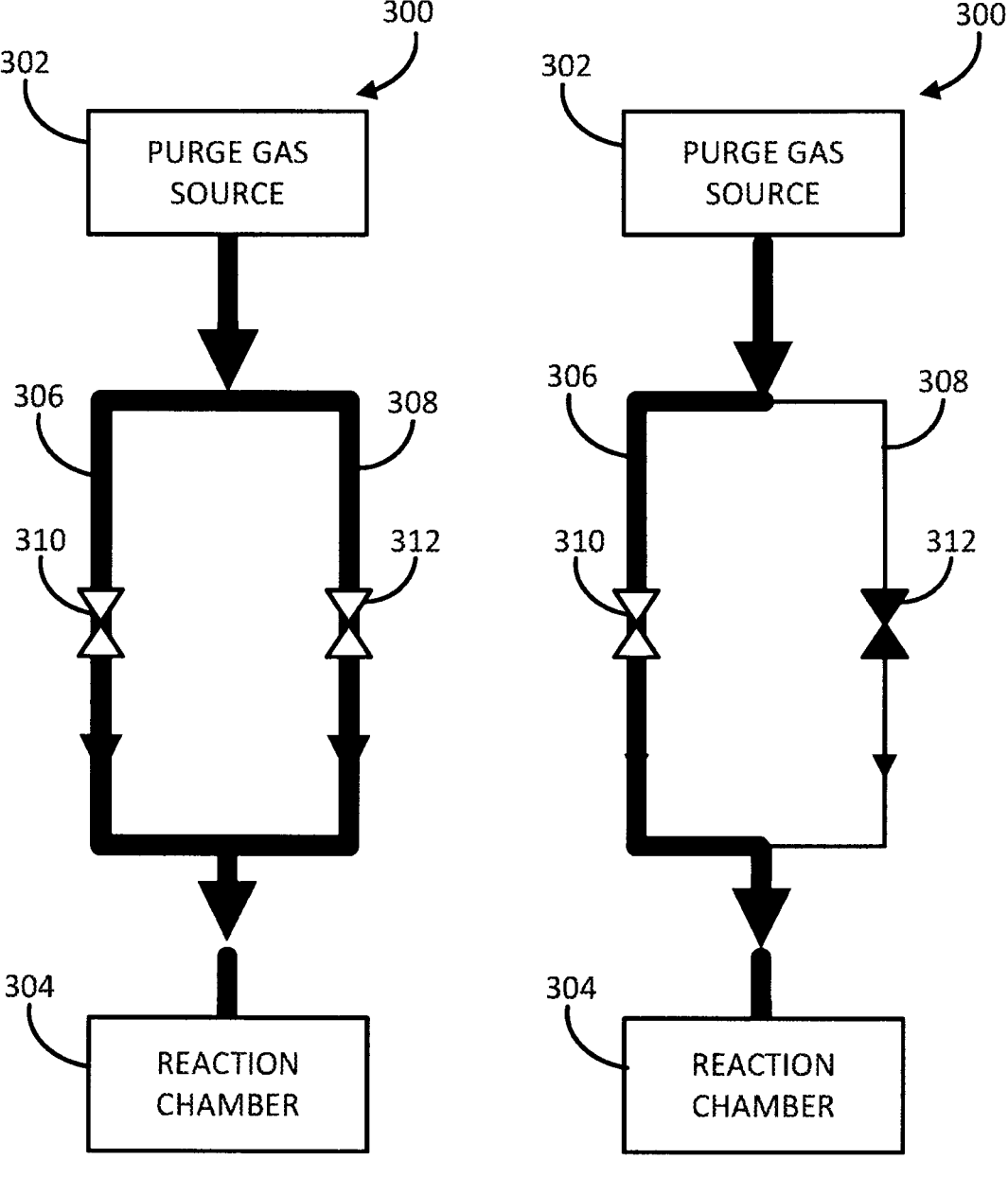
FIG. 4 illustrates an exemplary purge gas flow path through a fluidic circuit in accordance with the embodiments of the disclosure.
FIG. 5 illustrates a further exemplary purge gas flow path through a fluidic circuit in accordance with the embodiments of the disclosure.

To further illustrate the embodiments of the present disclosure, FIG. 4 and FIG. 5 illustrate exemplary flow paths for the purge gas into the reaction chamber, wherein the active flow path of the purge gas is illustrated by a broad line and the OPEN/CLOSED states of the first valve 310 and the second valve 312 are illustrated by either an unfilled, white valve symbol (OPEN) or a filled, black valve symbol (CLOSED). For example, FIG. 4. illustrates a first gas flow path (e.g., a high flow rate path) and FIG. 5 illustrates a second gas flow path (e.g., a low flow rate path)

Therefore, in some embodiments, performing the pulsed purge processes of the present disclosure comprises, flowing the purge gas a first flow rate into the reaction chamber through a first gas flow path, and flowing the purge at a second flow rate into the reaction chamber through a second gas flow path.

Accordingly, FIG. 4 illustrates a non-limiting example of the first flow path for introducing the purge gas into the reaction at the first flow rate. As illustrated in FIG. 4, the first flow path comprises both the low-flow channel 306 and the high-flow channel 308. Therefore, in such embodiments, flowing the purge gas at the first flow rate further comprises, flowing the purge gas through both the low-flow channel 306 and the high-flow channel 308. Further as illustrated in FIG. 4, the flow of the purge gas into the reaction chamber at the first flow rate comprises the setting of the optional first valve 310 in an OPEN state and the second valve 312 in an OPEN state.

Relatedly, FIG. 5 illustrates a non-limiting example of the second flow path for introducing the purge gas into the reaction at the second flow rate. As illustrated in FIG. 5, the second flow path comprises the low-flow channel 306 and not the high-flow channel 308. Therefore, in some embodiments, the second flow path comprises the low-flow channel 306 and not the high-flow channel 308. In such embodiments, flowing the purge gas at the second flow rate further comprises, flowing the purge gas through the low-flow channel 306. In some embodiments, flowing the purge gas at the second flow rate comprises, flowing the purge through the low-flow channel and not the high-flow channel. In some embodiments, flowing the purge gas at the second flow rate comprises, flowing the purge gas solely through the low-flow channel. 306 Further as illustrated in FIG. 5, the flow of the purge gas into the reaction chamber at the second flow rate further comprises setting the optional first valve 310 in an OPEN state and setting the second valve 312 in a CLOSED state.

As a non-limiting example of the embodiments of the present disclosure, the cycling of the pulsed purge process between the first flow rate and the second flow rate can be achieved by cycling (i.e., repeatably switching) the flow path taken by the purge gas to the reaction chamber. For example, the cycling of the flow rate of the purge gas can be achieved by switching between the first gas flow path (as illustrated in FIG. 4) and the second gas flow path (as illustrated in FIG. 5), or vice versa.

Therefore, in some embodiments, switching the purge gas flow rate between the first flow rate and the second flow rate comprises, closing a valve disposed along the high-flow channel. For example, switching the purge gas flow rate between a first flow rate (e.g., a high flow rate) and a second purge gas flow (e.g., a low flow rate) can comprise switching the second valve 312 disposed along the high-flow channel from an OPEN state to CLOSED state. In other words, switching the purge gas flow rate between a first flow rate (e.g., a high flow rate) and a second flow (e.g., a low flow rate) can comprise closing the second valve 312 disposed along the high-flow channel 308. In addition, the switching of the second valve 312 from an OPEN to a CLOSED state further comprises switching the flow path of the purge gas from the first flow path (FIG. 4) to the second flow path (FIG. 5).

Conversely, in some embodiments, switching the purge gas flow rate between the second flow rate and the first flow rate comprises, switching the second valve 312 disposed along the high-flow channel from a CLOSED state to an OPEN state. For example, switching the purge gas flow rate between a second flow rate (e.g., a low flow rate) and a first purge gas flow (e.g., a high flow rate) can comprise setting the second valve 312 disposed along the high-flow channel 308 to the OPEN state. In other words, switching the purge gas flow rate between a second flow rate (e.g., a low flow rate) and a first flow rate (e.g., a high flow rate) can comprise opening the second valve 312 disposed along the high-flow channel 308. In addition, the switching of the second valve 312 from a CLOSED to an OPEN state further comprises switching the flow path of the purge gas from the second flow path (FIG. 5) to the first flow path (FIG. 4).

It should be noted that as described above and illustrated in FIG. 4 and FIG. 5 the repeated cycling of the purge gas from the first flow rate to the second flow (or from a first flow path to a second flow path) is achieved by the repeated cycling of the second valve 312 between a CLOSED state and an OPEN state. Therefore, the first valve 310 disposed along the low-flow channel 306 can optionally be omitted without impacting the exemplary methods described above.

However, in alternative embodiments of the present disclosure, one of either the first flow rate and the second flow rate can include zero flow of purge gas into the reaction chamber. In such embodiments, the repeated cycling of the pulsed purge process can therefore include repeatedly switching between zero purge gas flow and a high purge gas flow. In such embodiments, zero purge gas flow can be achieved by placing both the first valve 310 and the second valve 312 in a CLOSED state, thereby preventing the flow of purge gas to the reaction chamber. After zero purge gas flow, the pulsed purge cycle can be switch to a high purge gas flow by opening the second valve 312 disposed along the high-flow channel 308. Therefore, in such embodiments, the first flow path can include a zero flow path.

As a result of enabling the repeated cycling of the flow rate of the purge gas flow between the first flow rate and the second flow rate by employing the exemplary fluidic circuit 300 (FIG. 3) and the methods described herein, the pulsed purge processes of the present disclosure may be rapidly performed, i.e., the switching of the purge gas flow from the first flow rate (e.g., a high flow rate) to a second flow rate (e.g., a low flow rate) can be performed in a very short time period.

Therefore, in some embodiments of the disclosure, switching between the first flow rate and the second flow rate (and vice versa) can be performed in a time period of less than 0.1 seconds, or less than 1 second, or less than 5 seconds, or less than 10 seconds. In some embodiments of the disclosure, switching between the first flow rate and the second flow rate (and vice versa) can be performed in a time period of between 0.1 seconds and 1 second, or between 1 second and 5 seconds, or between 5 seconds and 10 seconds, or between 10 seconds and 30 seconds.

In some embodiments, one or more parameters of the pulsed purge process (FIG. 2) can be controlled and/or optimized to obtain a required purging efficiency for the deposition of a desired film. As a non-limiting example, the pulse period that the purge gas flows at the first flow rate, i.e., the first pulse period (of sub-process 202) and/or the pulse period that the purge gas flows at the second flow rate, i.e., the second pulse period (of sub-process 204) can be altered and/or optimized depending on the deposition process and/or film to be deposited.

Accordingly, in some embodiments, the first pulse period is less than 0.05 seconds, or less than 1 second, or less than 10 seconds. In some embodiments, the first pulse period is greater than 0.05 seconds, or greater than 1 second, or greater than 10 seconds, or greater than 30 seconds. In some embodiments, the first pulse period is between 0.05 seconds and 1 seconds, or between 1 second and 5 seconds, or between 5 seconds and 10 seconds, or between 10 seconds and 30 seconds.

Likewise, in some embodiments, the second pulse period is less than 0.05 seconds, or less than 1 seconds, or less than 10 seconds. In some embodiments, the second pulse period is greater than 0.05 seconds, or greater than 1 second, or greater than 10 seconds, or greater 30 seconds. In some embodiments, the second pulse period is between 0.05 seconds and 5 seconds, or between 5 seconds and 10 seconds, or between 10 seconds and 30 seconds.

The resulting time period for performing a unit cycle of the pulsed purge process, i.e., the time period taken to perform one cycle of the pulsed purge process (FIG. 2) comprising the first pulse period and the second pulsed period is less than 1 second, or less than 5 seconds, or less than 10 seconds, or less than 20 seconds, or less than 30 seconds. In some embodiments, the time period taken to perform a unit cycle of the pulsed purge process (cyclical process 205, see FIG. 2) is greater than 1 second, or greater than 5 seconds, or greater than 10 seconds, or greater than 20 seconds, or greater than 30 seconds, or greater than 60 seconds. In some embodiments, the time period taken to perform a unit cycle of the pulsed purge process (cyclical process 205, see FIG. 2) (FIG. 2) is between 1 second and 5 seconds, or between 5 seconds and 10 seconds, or between 10 seconds and 20 seconds, or between 20 seconds and 30 seconds, or between 30 seconds and 60 seconds. It should be noted the time taken for performing a unit cycle of the pulsed purge process can include both the first pulse period and the second pulse period as well the time required to switch back and forth between the two flow rates.

In some embodiments, a unit cycle of the pulsed purge process (FIG. 2) is repeated one or more times. For example, a unit cycle of the pulsed purge can be performed 1, or 2, or 3, or 4, or 5, or 10, or 20, or 30, or 40, or 50 times. In such embodiments, the total time period that the pulsed purge process is performed (i.e., the total time period for the completion of a predetermined number of repeated cycles of the pulsed purge process) is less than 1 second, or less than 5 seconds, or less than 10 seconds, or less than 100 seconds, or less than 300 seconds, or less than 500 seconds, or less than 1000 seconds. In some embodiments, the total time period that the pulsed purge process is performed is greater than 1 seconds, or greater than 5 seconds, or greater than 10 seconds, or greater than 100 seconds, or greater than 300 seconds, or greater than 500 seconds, or greater than 1000 seconds. In some embodiments, the total time period that the pulsed purge process is performed is between 1 seconds and 1000 seconds, or between 10 seconds and 500 seconds, or between 30 seconds and 300 seconds, or between 50 seconds and 100 seconds.

In addition to the duration of the purge pulses, the pulsed purge processes of the present disclosure may be controlled and/or optimized by the selection of the duty cycle of the pulsed purge process, wherein the duty cycle (D) as referred to herein is the first pulse period of the purge gas flow at the first flow rate (Period First Flow Rate) divided by the time to perform a unit pulsed purge cycle (Period Unit Cycle) given as percentage, i.e., given as a formula (I):

$$D(\%) = \frac{\text{Period First Flow Rate}}{\text{Period Unit } Cyle} \times 100 \tag{I}$$

Therefore, in some embodiments, the duty cycle of the pulsed purge process is greater than 1%, or is greater than 10%, or greater than 30%, or greater than 50%, or greater than 70%, or greater than 90%. In some embodiments, the duty cycle of the pulsed purge process is less than 1%, or less than 10%, or less than 25%, or less than 70%, or less than 90%. In some embodiments, the duty cycle of the pulsed purge process is between 1% and 90%, or between 20% and 80%, or between 30%, and 70%, or between 40%, and 60%.

The cyclical deposition processes, including pulsed purge processes, of the present disclosure may be employed for the deposition of films on the surface of a substrate, and particularly can be utilized for the conformal deposition of films on substrates including HAR features and/or for the filling of HAR features (both vertical and horizontal HAR features) with a gap-filling film without the formation of undesirable seams and/or voids. In particular, the embodiments of the present disclosure, can be employed in cyclical deposition process that make use of certain reactants that can be demanding in terms of the ability to efficiently and effectively purge such reactants from the reaction chamber and particular from HAR features on a substrate.

In more detail, certain reactants employed in cyclical deposition processes, such as, for example, ALD, or PEALD, etc., can be characterized as being "sticky" when compared with other less problematic reactants. Such "sticky" reactants, as the term implies, can be difficult to purge from the reaction chamber and the substrate disposed therein. For example, the "stickiness" of a reactant can be described in terms of it's "sticking coefficient" which is a parameter used in the surface sciences to described the ratio of the number of adsorbate atoms (or molecules) that absorb, or "stick", to a surface relative to the total number of atoms (or molecules) that impinge upon that surface during the same period of time. The sticking coefficient has a value between 100% (all impinging atoms/molecules stick) and 0% (no atoms/molecules sticks) and is a function of a number of properties, including, but not limited to, surface temperature, surface coverage, and the kinetic energy of impinging particles.

As a non-limiting example, the exemplary cyclical deposition processes of the present disclosure can be utilized for the deposition of oxide films employing water vapor ($H_2O$), or hydrogen peroxide vapor ($H_2O_2$) as the oxygen reactant. In further non-limiting examples, the exemplary cyclical deposition processes of the present disclosure can be utilized for the deposition of nitride films employing ammonia ($NH_3$) as the nitrogen reactant.

In more detail, the exemplary method 100 (FIG. 1) of the present disclosure can be utilized in the cyclical deposition of a film employing one or more reactants selected from the group consisting of water vapor ($H_2O$), hydrogen peroxide vapor ($H_2O_2$), and ammonia ($NH_3$). Further non-limiting examples of reactants that can be utilized in the methods of the present disclosure include, but are not limited to, hydrogen ($H_2$), ozone ($O_3$), oxygen ($O_2$), and alcohol vapors. It should be noted that the example reactants given above are instances of reactants that could benefit most significantly from the processes outlined herein, i.e., such reactants can be more efficiently purged by the pulsed purge processes described herein. However, other reactants not given as examples herein would also benefit from the pulsed purge processes of the present disclosure.

As a non-limiting example, the exemplary method 100 (FIG. 1) may be utilized for the deposition of an aluminum oxide film, wherein contacting the substrate with a first reactant (process step 104) comprises, contacting the substrate with a vapor phase aluminum reactant, and contacting the substrate with a second reactant (process step 108) comprises, contacting the substrate with a vapor phase oxygen reactant. In such embodiments, the vapor phase aluminum reactant is selected from the group consisting of trimethylaluminum (TMA), triethylaluminum (TEA), dimethylaluminum hydride (DMAH), dimethylethylaminealane (DMEAA), trimethylaminealane (TEAA), tritertbutylaluminum (TTBA), and N-methylpyrroridinealance (MPA). In addition, in such embodiments, the vapor phase oxygen reactant is selected from the group consisting of water vapor ($H_2O$), and hydrogen peroxide vapor ($H_2O_2$). In some embodiments, the second reactant has a higher sticking coefficient than the first reactant. Alternatively, in some embodiments, the first reactant has a higher sticking coefficient than the second reactant.

In some embodiments, a number of pulsed purge cycles as described herein (and illustrated in FIG. 2) may be performed to purge the reaction chamber and the substrate therein after the introduction of the second reactant, i.e., during the purging process step 110 of FIG. 1. In some embodiments, a purge process performed to purge the reaction and the substrate therein after the introduction of the first reactant, i.e., during the purging process step 106, may comprise a static, continuous purge process, i.e., without performing a pulsed purge process as described herein. In some embodiments, a static, continuous purge process may be performed after the introduction of a vapor phase aluminum reactant. In some embodiments, a pulsed purge process may be performed after the introduction of a vapor phase oxygen reactant selected from the group consisting of water vapor ($H_2O$), and hydrogen peroxide vapor ($H_2O_2$). In alternative embodiments, a pulsed purge process may be performed to purge the reaction chamber after the introduction of the first reactant and a static, continuous purge process may be performed to purge the reaction chamber after the introduction of the second reactant.

Figure 6:
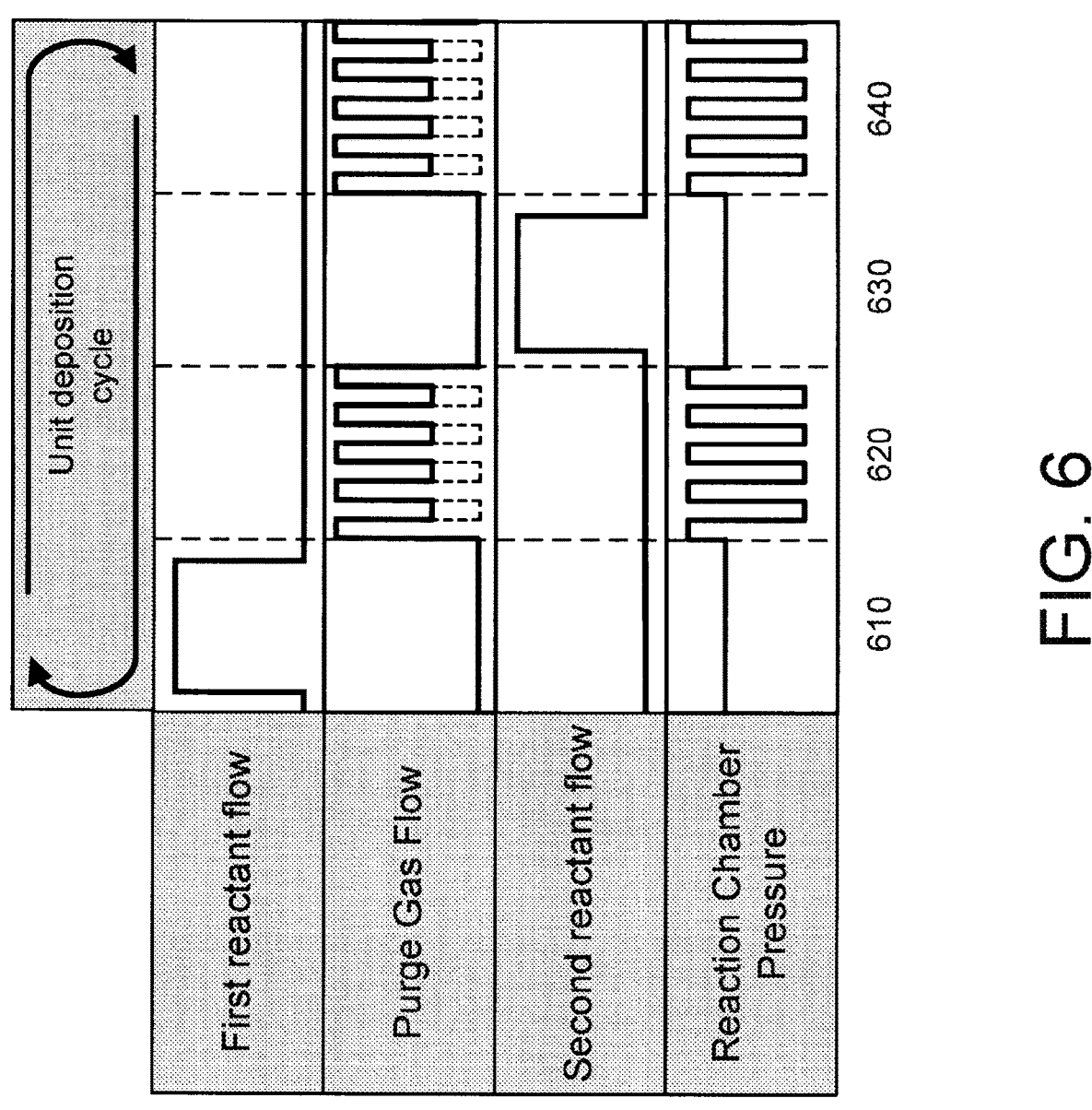
FIG. 6 illustrates an exemplary deposition cycle of a cyclical deposition process employing pulsed purge processes in accordance with the embodiments of the disclosure.

A further overview of the cyclical deposition methods, and particularly the pulsed purge process of the present disclosure is illustrated with reference to FIG. 6 which illustrates an exemplary unit deposition cycle of the cyclical deposition method 100 (FIG. 1) including a number of pulsed purge cycles. As illustrated in FIG. 6, the horizontal axis represents the time parameter but does not necessarily represent the actual time length of individual processes, and the vertical axis represents an ON-state or OFF-state for reactant flow and purge gas flow, wherein a raised level on the vertical axis of each parameter represents an ON-state. However, the vertical axis of each line does not necessarily represent the actual quantity of the associated parameter, whereas a bottom level of each line on the vertical axis represents an OFF-state, i.e., zero reactant flow/purge gas flow. The vertical axis can also represent the variation in the reaction chamber pressure over the time period of a unit deposition cycle without necessarily representing a specific chamber pressure.

In brief, in a first period 610 (i.e., the first reactant period) of the unit deposition cycle, the first reactant is introduced into the reaction chamber. In this first period 610, the first reactant can be introduced into the reaction chamber, contact the substrate, and chemisorb on the surface of the substrate forming at most a monolayer. In some embodiments, first reactant can comprise a vapor phase aluminum reactant.

In a second period 620 (i.e., a pulsed purge period) the flow of the first reactant is stopped and the flow of the purge gas is cycled repeatedly between a first flow rate (e.g., a high flow regime) and a second flow rate (e.g., a low flow regime) such that the reaction chamber and substrate disposed therein is purged of excess first reactant and any reaction by-products. The pulsed purge process is illustrated in FIG. 6 as commencing with an initial high flow rate followed by a subsequent lower flow rate, however it should be appreciate that this order can be reversed with the pulsed purge process commencing with an initial low flow rate followed by a subsequent high flow rate. In addition, the transition between the first flow rate (e.g., high flow rate) and the second flow rate (e.g., a low flow rate) is illustrated in FIG. 6 as a linear step function, however, it should be appreciated the purge gas flow can be ramped in both a linear or a non-linear manner between the first flow rate and the second flow rate, and vice versa. Alternatively, the second flow rate (or first flow rate) of the pulsed purge process can include a zero flow rate of purge gas, as indicated by the dashed flow line in the second period 620. Also in the second period 620, the pressure in the reaction chamber sequential and alternating cycles between a higher reaction chamber pressure and a lower reaction chamber pressure (or vice versa).

In a third period 630 (i.e., the second reactant period) the second reactant is introduced into the reaction chamber. In this third period 630, the second reactant can be introduced into the reaction chamber and react with the chemisorb first reactant on the surface of the substrate thereby depositing a portion of the desired film on the surface of the substrate. In some embodiments, the second reactant can comprise a vapor phase oxygen reactant, such as, water vapor ($H_2O$), or hydrogen peroxide vapor ($H_2O_2$), for example.

In a fourth period 640 (i.e., a pulsed purge period) the flow of the second reactant is stopped and the flow of the purge gas is cycled repeatedly from a first flow rate (e.g., a high flow rate) to a second flow rate (e.g., a low flow rate) such that the reaction chamber and substrate disposed therein is purged of excess second reactant and any reaction by-products. Alternatively, the second flow rate (or the first flow rate) of the pulsed purge process can include a zero flow rate of purge gas, as indicated by the dashed flow line in the fourth period 640. Also in the fourth period 640, the pressure in the reaction chamber sequential and alternating cycles between a higher reaction chamber pressure and a lower reaction chamber pressure (or vice versa)

The exemplary unit deposition cycle as illustrated in FIG. 6 can then be repeated multiple times as desired to deposit a film (e.g., an aluminum oxide film) with a desired thickness and film properties.

Therefore, the embodiments of the present disclosure may be employed for the deposition of high quality films. In some embodiments, the cyclical deposition processes of the present disclosure can be employed in the deposition of an aluminum oxide film. In some embodiments, the aluminum oxide film is deposited on a non-planar substrate including a plurality of high aspect ratio (HAR) features. In some embodiments, the plurality of HAR features can have an aspect ratio greater than 2:1, or greater than 5:1, or greater than 10:1, or greater than 25:1, or greater than 50:1, or greater than 100:1, wherein "greater than" as used in this example refers to a greater distance in the height (or depth) of the HAR feature. In some embodiments, the plurality of high aspect ratio features can have an aspect ratio greater be greater than 1:2, or greater than 1:5, or greater than 1:10, or greater than 1:25, or greater than 1:50, or greater than 1:100, wherein "greater than" as used in this example refers to a greater distance in the width of the HAR feature.

In some embodiments, the high aspect ratio features comprise at least one of vertical features and horizontal features. In some embodiments, the high aspect ratio features comprise vertical HAR features with an aspect ratio greater than 25:1 (length:width). In some embodiments, the HAR features comprise horizontal HAR features with an aspect ratio greater than 1:25 (length:width).

As described above, the cyclical deposition methods or the present disclosure can be utilized for the deposition an aluminum oxide film. In such embodiments, the deposited aluminum oxide film can fill a plurality of the non-planar HAR features without the formation of a seam and/or void(s) within the non-planar HAR features. In some embodiments, the deposited aluminum oxide film covers the plurality of non-planar HAR features with a step coverage greater than 50%, or greater than 60%, or greater than 70%, or greater than 80%, or great than 90%, or greater than 95%, or greater than 99%. In some embodiments, the deposited aluminum oxide film covers the plurality of non-planar HAR features with a step coverage of 100%.

In addition, in some embodiments, the plurality of non-planar HAR features can comprise a plurality of three-dimensional partially fabricated device structures and the deposited aluminum oxide film covers the plurality of three-dimensional partially fabricated device structures with a step coverage greater than 50%, or greater than 60%, or greater than 70%, or greater than 80%, or great than 90%, or greater than 95%, or greater than 98%, or greater than 99%. In some embodiments, the deposited aluminum oxide film covers the plurality of three-dimensional partially fabricated device structures with a step coverage of 100%. In such embodiments, the three-dimensional partially fabricated device structures can comprise, partially fabricated DRAM device structures, partially fabricated gate-all-around (GAA) transistor device structure, partially fabricated nanosheet device structure, partially fabricated forksheet device structure, partially fabricated complementary FET (CFET) device structure, or partially fabricated memory device structure.

Embodiments of the present disclosure may also include apparatus constructed and arranged for performing the exemplary methods of the present disclosure, such as, for example, the cyclical deposition methods including pulsed purge cycles as described herein.

Figure 7:
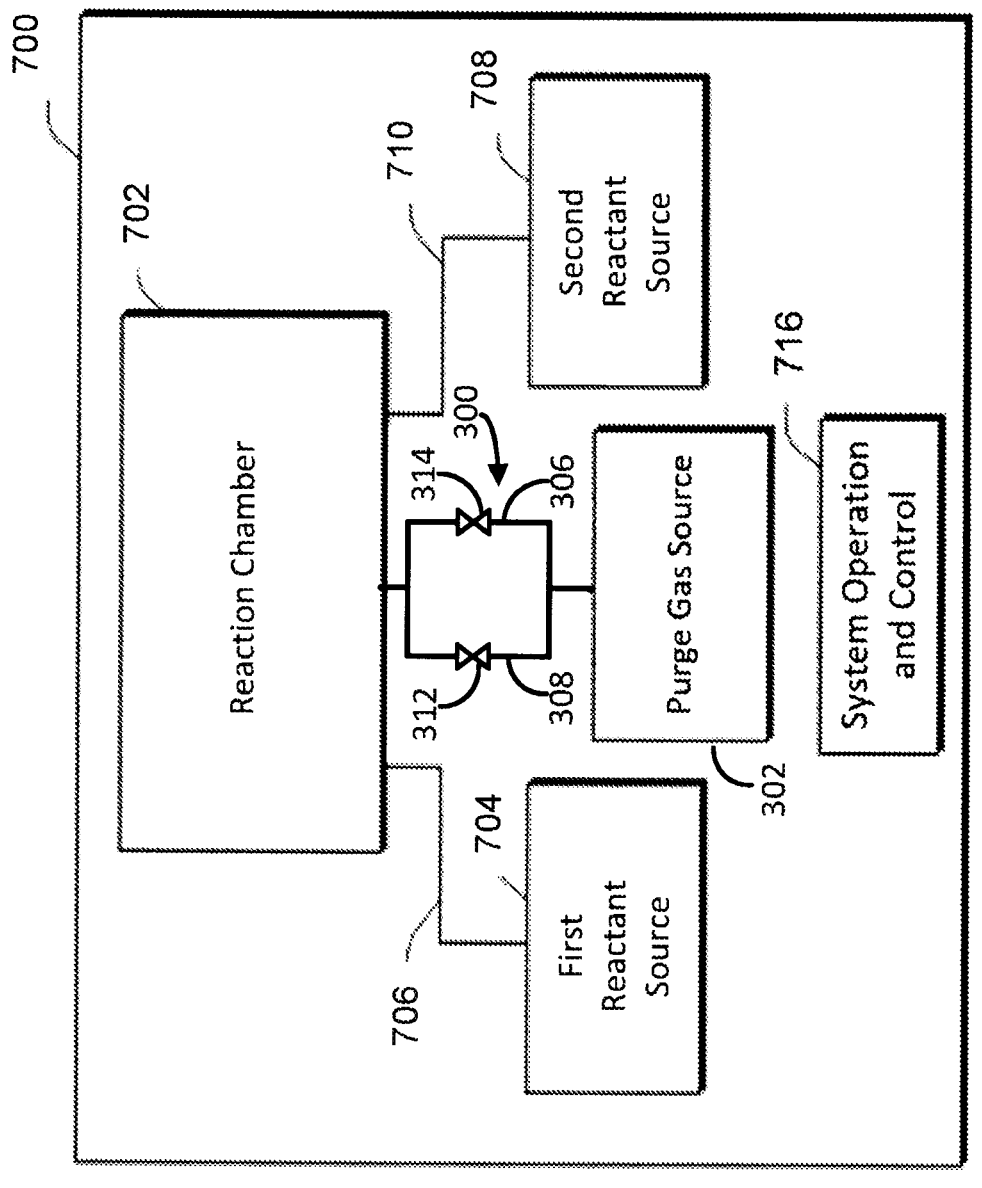
FIG. 7 illustrates an exemplary apparatus configured for performing the methods described herein in accordance with the embodiments of the disclosure.

In more detail, FIG. 7 schematically illustrates a reaction system 700 including a reaction chamber 702 that further includes mechanism for retaining a substrate (not shown) under predetermined pressure, temperature, and ambient conditions, and for selectively exposing the substrate to various gases. A first reactant source 704 may be coupled by conduits 706 or other appropriate means to the reaction chamber 702, and may further couple to a manifold, valve control system, mass flow control system, or mechanism to control a gaseous reactant originating from the first reactant source 704. A first reactant (not shown) supplied by the first reactant source 704 may be liquid or solid under room temperature and standard atmospheric pressure conditions. Such a first reactant may be vaporized within a reactant source vacuum vessel, which may be maintained at or above a vaporizing temperature within a precursor source chamber. In such embodiments, the vaporized first reactant may be transported with a carrier gas (e.g., an inactive or inert gas) and then fed into the reaction chamber 702 through conduit 706. In other embodiments, the first reactant may be a vapor under standard conditions. In such embodiments, the first reactant does not need to be vaporized and may not require a carrier gas. For example, in one embodiment the first reactant may be stored in a gas cylinder. For example, the first reactant source 704 may be constructed and configured for supplying a vapor phase aluminum reactant to the reaction chamber 702.

The reaction system 700 can also include additional reactant sources, such as a second reactant source 708 which may also be coupled to the reaction chamber by conduits 710 as described above. For example, the second reactant source 708 may be constructed and configured for supplying an oxygen reactant or a nitrogen reactant to the reaction chamber 702.

A purge gas source 302 may also be coupled to the reaction chamber 702 via the fluidic circuit 300 as described previously with reference to FIG. 3, FIG. 4 and FIG. 5. The fluidic circuit 300 can be employed to supply a purge gas to the reaction chamber 702 using the pulsed purge processes of the present disclosure.

The reaction system 700 of FIG. 7, may also comprise a system operation and control mechanism 716 that provides electronic circuitry and mechanical components to selectively operate valves, manifolds, pumps and other equipment included in the reaction system 700. Such circuitry and components operate to introduce the reactants, purge gases from the respective sources 704, 708, and purge gas source 302. The system operation and control mechanism 716 also controls timing of gas pulse sequences, temperature of the substrate and reaction chamber 702, and pressure of the reaction chamber 702 and various other operations necessary to provide proper operation of the reaction system 700.

The system operation and control mechanism 716 can also control the parameters of the pulsed purge process employed to purge the reaction chamber, such as, for example, by controlling the purge pulse periods, the cycling of the purge gas flow from a first flow rate to and second flow rate, the duty cycle of the pulsed purge, etc. The control mechanism 716 can include modules such as a software or hardware component, e.g., a FPGA or ASIC, which performs certain tasks. A module can advantageously be configured to reside on the addressable storage medium of the control system and be configured to execute one or more processes.

Those of skill in the relevant arts appreciate that other configurations of the present reaction system are possible, including a different number and kind of precursor reactant sources and purge gas sources. Further, such persons will also appreciate that there are many arrangements of valves, conduits, reactant sources, purge gas sources that may be used to accomplish the goal of selectively feeding gases into reaction chamber 702. Further, as a schematic representation of a reaction system, many components have been omitted for simplicity of illustration, and such components may include, for example, various valves, manifolds, purifiers, heaters, containers, vents, and/or bypasses.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method for depositing a film on a substrate, the method comprising:

seating a substrate within a reaction chamber;

sequentially and alternatingly contacting the substrate with a plurality of pulsed reactant flows of at least a first reactant and a second reactant; and performing multiple cycles of a pulsed purge process between selected pulsed reactant flows to introduce a purge gas into the reaction chamber, wherein a cycle of the multiple cycles of the pulsed purge process comprises switching between:

introducing the purge gas into the reaction chamber at a first flow rate; and introducing the purge gas into the reaction chamber at a second flow rate, wherein the first flow rate is different to the second flow rate.

2. The method of claim 1, wherein the first flow rate is greater than the second flow rate.

3. The method of claim 1, wherein the second flow rate is zero, such that introduction of the purge gas into the reaction chamber is ceased during the introducing the purge gas into the reaction chamber at the second flow rate.

4. The method of claim 1, wherein the pulsed purge process further comprises, sequentially and alternately increasing and decreasing a pressure within the reaction chamber.

5. The method of claim 1, wherein the performing multiple cycles of the pulsed purge process further comprises, flowing the purge gas at the first flow rate into the reaction chamber through a first gas flow path, and flowing the purge gas at the second flow rate into the reaction chamber through a second gas flow path.

6. The method of claim 5, wherein the flowing the purge gas into the reaction chamber is sequentially and alternately switched between the first gas flow path and the second gas flow path.

7. The method of claim 5, wherein a fluidic circuit fluidically connecting a purge gas source to the reaction chamber comprises a low-flow channel and a high-flow channel.

8. The method of claim 7, wherein the first gas flow path comprises both the low-flow channel and the high-flow channel and is configured to deliver the purge gas to the reaction chamber at the first flow rate.

9. The method of claim 8, wherein the second gas flow path comprises the low-flow channel, but not the high-flow channel, and is configured to deliver the purge gas to the reaction chamber at the second flow rate, wherein the first flow rate is greater than the second flow rate.

10. The method of claim 2, wherein switching the purge gas flow between the first flow rate and the second flow rate comprises closing a valve disposed along the high-flow channel.

11. The method of claim 10, wherein switching the purge gas flow between the second flow rate and the first flow rate comprises opening the valve disposed along the high-flow channel.

12. The method of claim 7, wherein flowing the purge gas at the first flow rate further comprises, flowing the purge gas through both the low-flow channel and the high-flow channel.

13. The method of claim 10, wherein flowing the purge gas at the second flow rate further comprises, flowing the purge gas through the low-flow channel and not the high-flow channel.

14. The method of claim 1, wherein switching between the first flow rate and the second flow rate is performed in less than 0.1 seconds.

15. The method of claim 1, wherein a pulse period for introducing the purge gas into the reaction chamber at the first flow rate is less than 30 seconds.

16. The method of claim 1, wherein a pulse period for introducing the purge gas into the reaction chamber at the second flow rate is less than 1 second.

17. The method of claim 1, wherein a duty cycle of the pulsed purge process is greater than 1 percent (%).

18. The method of claim 1, wherein the second reactant is selected from the group consisting of water vapor ($H_2O$), hydrogen peroxide vapor ($H_2O_2$), ammonia ($NH_3$), hydrogen ($H_2$), ozone ($O_3$), oxygen ($O_2$), and alcohol vapors.

19. The method of claim 1, wherein the first reactant has a sticking coefficient less than the second reactant.

20. The method of claim 1, wherein the deposited film comprises a conformal aluminum oxide film with a step coverage greater than 95 percent (%).

21. The method of claim 20, wherein the conformal aluminum oxide film fills a plurality of non-planar features on the substrate without formation of a seam within the non-planar features.

22. The method of claim 21, wherein the plurality of non-planar features comprise a plurality of three-dimensional partially fabricated device structures and the conformal aluminum oxide film covers the plurality of three-dimensional partially fabricated device structures with a step coverage greater than 98 percent (%).

23. A method of depositing a film on a substrate, the method comprising:

seating a non-planar substrate within a reaction chamber;

depositing a conformal film on a surface of the non-planar substrate by performing one or more deposition cycles of a cyclical deposition process, wherein a unit deposition cycle of the cyclical deposition process comprises:

contacting the substrate with a first vapor phase reactant;

contacting the substrate with a second vapor phase reactant; and between selected contacting steps, sequentially and alternately switching between a high-flow gas path and a low-flow gas path fluidly connecting a purge gas source to the reaction chamber, thereby cycling the flow rate of the purge gas into the reaction chamber between a first flow rate through the high-flow gas path and a second flow rate through the low-flow gas path, wherein the first flow rate is greater than the second flow rate.

24. A method of depositing a film on a substrate, the method comprising:

seating a non-planar substrate within a reaction chamber;

contacting the substrate with a plurality of pulsed flows of a reactant at spaced apart time intervals into the reaction chamber to deposit a film on the substrate; and performing a cyclical purge process to remove excess reactant from the reaction chamber between selected pulsed flows of the plurality of pulsed flows, wherein the cyclical purge process comprises:

increasing the pressure within the reaction chamber by introducing a purge gas into the reaction chamber at a first flow rate through a high-flow gas path;

decreasing the pressure within the reaction chamber by introducing the purge gas into the reaction chamber at a second flow rate though a low-flow gas path, wherein the first flow rate is greater than the second flow rate; and re-increasing the pressure within the reaction chamber by introducing the purge gas into the reaction chamber at the first flow rate through the high-flow gas path.

\* \* \* \* \*